(12) United States Patent
Kumar et al.

(10) Patent No.: US 9,461,008 B2
(45) Date of Patent: Oct. 4, 2016

(54) SOLDER ON TRACE TECHNOLOGY FOR INTERCONNECT ATTACHMENT

(71) Applicant: QUALCOMM Incorporated, San Diego, CA (US)

(72) Inventors: Rajneesh Kumar, San Diego, CA (US); Omar J. Bchir, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/787,444

(22) Filed: Mar. 6, 2013

(65) Prior Publication Data
US 2014/0048931 A1 Feb. 20, 2014

Related U.S. Application Data

(60) Provisional application No. 61/684,129, filed on Aug. 16, 2012.

(51) Int. Cl.
*H01L 23/00* (2006.01)
*H01L 21/48* (2006.01)
(Continued)

(52) U.S. Cl.
CPC ............ *H01L 24/13* (2013.01); *H01L 21/4867* (2013.01); *H01L 23/49811* (2013.01); *H01L 24/11* (2013.01); *H05K 3/3436* (2013.01); *H01L 23/147* (2013.01); *H01L 24/16* (2013.01); *H01L 24/81* (2013.01); *H01L 2224/0401* (2013.01); *H01L 2224/05548* (2013.01); *H01L 2224/119* (2013.01); *H01L 2224/1132* (2013.01); *H01L 2224/1147* (2013.01); *H01L 2224/11849* (2013.01); *H01L 2224/131* (2013.01);
(Continued)

(58) Field of Classification Search
CPC .. H01L 24/11; H01L 24/13; H01L 23/49811; H01L 21/4867; H01L 24/10; H01L 24/12; H01L 24/14; H01L 24/15; H01L 24/16; H01L 24/17; H05K 3/3436
See application file for complete search history.

(56) References Cited

U.S. PATENT DOCUMENTS 6,109,507 A * 8/2000 Yagi et al. ............... 427/97.2
6,264,097 B1 * 7/2001 Sano ........................ 228/245
(Continued)

FOREIGN PATENT DOCUMENTS

CN 102625575 A 8/2012
JP H0298993 A 4/1990
(Continued)

OTHER PUBLICATIONS

Baumgartner T., et al., "Printing Solder Paste in Dry Film—A Low Cost Fine-Pitch Bumping Technique," Electronics Packaging Technology Conference, 2007, EPTC 2007, 9th, IEEE, Piscataway, NJ, USA, Dec. 10, 2007, pp. 609-612, XP031238085, ISBN: 978-1-4244-1324-9.

(Continued)

*Primary Examiner* — Jarrett Stark
*Assistant Examiner* — Bitew Dinke
(74) *Attorney, Agent, or Firm* — Michelle S. Gallardo (57) ABSTRACT

A solder on trace device includes a conductive trace on a semiconductor substrate surface. The conductive trace has a sidewall and a bonding surface. The solder on trace device also includes a passivation layer on at least one end of the conductive trace. The solder on trace device further includes a pre-solder material on the sidewall and the bonding surface of the conductive trace.

23 Claims, 8 Drawing Sheets

(51) Int. Cl.
*H01L 23/498* (2006.01)
*H05K 3/34* (2006.01)
*H01L 23/14* (2006.01)

(52) U.S. Cl.
CPC ........... *H01L 2224/13006* (2013.01); *H01L 2224/13024* (2013.01); *H01L 2224/13082* (2013.01); *H01L 2224/73204* (2013.01); *H01L 2224/814* (2013.01); *H01L 2224/81193* (2013.01); *H01L 2224/81409* (2013.01); *H01L 2224/81411* (2013.01); *H01L 2224/81815* (2013.01); *H01L 2224/94* (2013.01); *H01L 2924/12042* (2013.01); *H05K 3/3468* (2013.01); *H05K 3/3484* (2013.01); *H05K 2201/10674* (2013.01); *Y02P 70/613* (2015.11)

(56) References Cited

U.S. PATENT DOCUMENTS

| | | | |
|---|---|---|---|
| 6,391,684 B2 | 5/2002 | Ohsawa | |
| 6,555,296 B2* | 4/2003 | Jao et al. | 430/312 |
| 7,608,929 B2 | 10/2009 | Hu | |
| 8,101,866 B2* | 1/2012 | Hsu | 174/257 |
| 8,198,727 B1* | 6/2012 | Singh et al. | 257/737 |
| 8,802,556 B2* | 8/2014 | Bchir et al. | 438/614 |
| 2002/0064933 A1* | 5/2002 | Ueoka | 438/615 |
| 2004/0115934 A1* | 6/2004 | Broz | H01L 21/31116 438/689 |
| 2005/0136641 A1 | 6/2005 | Rinne | |
| 2007/0269973 A1* | 11/2007 | Nalla et al. | 438/612 |
| 2009/0041981 A1* | 2/2009 | Hsu | 428/138 |
| 2009/0085206 A1* | 4/2009 | Bchir et al. | 257/738 |
| 2009/0102062 A1 | 4/2009 | Sato et al. | |
| 2009/0181223 A1* | 7/2009 | Buchwalter | B23K 1/0016 428/198 |
| 2009/0189296 A1 | 7/2009 | Wu et al. | |
| 2009/0325348 A1* | 12/2009 | Gerber | C09J 163/00 438/120 |
| 2011/0074022 A1 | 3/2011 | Pendse | |
| 2011/0079926 A1 | 4/2011 | Chung et al. | |
| 2011/0147927 A1* | 6/2011 | Hagihara | 257/737 |
| 2011/0201194 A1* | 8/2011 | Gruber et al. | 438/613 |
| 2011/0241203 A1* | 10/2011 | Nakasato et al. | 257/737 |
| 2011/0287583 A1* | 11/2011 | Stapleton | 438/109 |
| 2012/0161312 A1* | 6/2012 | Hossain | H01L 23/49816 257/737 |
| 2012/0267778 A1* | 10/2012 | Asami | 257/737 |
| 2012/0305633 A1* | 12/2012 | Feger et al. | 228/203 |
| 2012/0318855 A1* | 12/2012 | McLeod et al. | 228/203 |
| 2013/0082091 A1* | 4/2013 | Matejat et al. | 228/176 |
| 2013/0099370 A1* | 4/2013 | Cheng et al. | 257/737 |
| 2014/0057392 A1* | 2/2014 | Nah et al. | 438/108 |

FOREIGN PATENT DOCUMENTS

| | | |
|---|---|---|
| JP | 11074298 A | 3/1999 |
| JP | 2005217065 A | 8/2005 |

OTHER PUBLICATIONS

International Search Report and Written Opinion—PCT/US2013/054849—ISAEPO—Jan. 7, 2014.

\* cited by examiner

SOLDER ON TRACE TECHNOLOGY FOR
INTERCONNECT ATTACHMENT

CROSS REFERENCE TO RELATED APPLICATION

The present application claims the benefit of U.S. Provisional Patent Application No. 61/684,129 filed on Aug. 16, 2012, in the names of R. Kumar et al., the disclosure of which is expressly incorporated by reference herein in its entirety.

TECHNICAL FIELD

The present disclosure generally relates to integrated circuits (ICs). More specifically, the present disclosure relates to a solder on trace technology for a fine pitch flip chip.

BACKGROUND

Flip chip technology is an alternative to conventional wire bonding technology. Flip chip technology uses face up chips (or dies) and individual wires for connecting each electrical pad on a top surface of a chip to the supporting substrate. Conversely, a flip chip microelectronic assembly enables direct electrical connections between the electronic components of a chip and a corresponding supporting substrate. The electronic components are generally mounted face down (i.e., "flipped") on the semiconductor chips and connected, both electrically and physically, to the substrate by conductive solder bumps. Flip chips are beneficial because the chip is directly attached (electrically and physically) to the semiconductor substrate, board, or carrier by the solder bumps.

Flip chips may be fabricated by a process that includes placing solder bumps on a semiconductor substrate. The solder bumps of the flip chip assembly provide an electrically conductive path from the chip to the semiconductor substrate on which the chip is mounted. The bumps also provide a thermally conductive path to carry heat from the chip to the semiconductor substrate. The bumps generally provide the mechanical mounting of the chip to the semiconductor substrate. The bumps may also act as a spacer that prevents unwanted electrical contact between the chip and the semiconductor substrate connectors. The bumps can relieve mechanical strain between the chip and the semiconductor substrate.

Unfortunately, fine pitch flip chip technology is limited when providing sufficient and reliable semiconductor substrate pad to die bump joints due to the inability to provide a confined wetting surface for the solder bumps. As described herein, the term "wetting" may refer to the degree with which a liquid maintains adherence to a solid surface for bonding two materials. In this scenario, a wetting surface on the semiconductor substrate enables a connection between the solder bumps on the flip chip and the bond pads or traces on the semiconductor substrate.

One technique for priming a semiconductor substrate for solder ball connection is the application of a flux material. The flux material may be applied on an oxidized portion of a trace/pad for reactivating the trace/pad on a semiconductor substrate to join with a conductive interconnect (e.g., a solder ball). Unfortunately, the application of a flux material can cause voiding in the process due to outgassing of the flux material. Another technique is the application of a surface finish on the trace/pad of the semiconductor substrate to enable the solder ball connection. Unfortunately, the use of a surface finish may activate the entire trace, rather than a specific bond area for joining with a conductive interconnect (e.g., a solder ball). In this scenario, the solder from the solder balls may wet through the entire trace/pad, beyond the specific bond area. Open circuits and/or bridging may result from the solder wetting on the entire trace.

SUMMARY

According to one aspect of the present disclosure, a solder on trace device is described. The solder on trace device includes a conductive trace on a semiconductor substrate surface. The conductive trace has a sidewall and a bonding surface. The solder on trace device also includes a passivation layer on at least one end of the conductive trace. The solder on trace device further includes a pre-solder material on the sidewall and bonding surface of the conductive trace.

According another aspect of the present disclosure, a method for fabricating solder on trace device is described. The method includes opening a layer on a surface of a semiconductor substrate to expose an active bonding area on a conductive trace on the surface of the semiconductor substrate. The method also includes applying a film resist to an entire surface of the semiconductor substrate. The method further includes removing the film resist to expose a portion of the conductive trace including a sidewall and a bonding surface of the conductive trace. In addition, the method includes applying a pre-solder material on the active bonding area of the conductive trace. The method also includes reflowing the pre-solder material to ball-up the pre-solder material. The method further includes removing the film resist to expose portions of the conductive trace that are not covered by the pre-solder material.

According to a further aspect of the disclosure, a solder on trace device is described. The solder on trace device includes a means for interconnecting, provided on a semiconductor substrate surface. The interconnecting means has a sidewall and a bonding surface. The solder on trace device also includes a means for passivating, on at least one end of the interconnecting means. The solder on trace device includes a means for conducting a sidewall and a bonding surface of the interconnecting means.

This has outlined, rather broadly, the features and technical advantages of the present disclosure in order that the detailed description that follows may be better understood. Additional features and advantages of the disclosure are described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 1A:
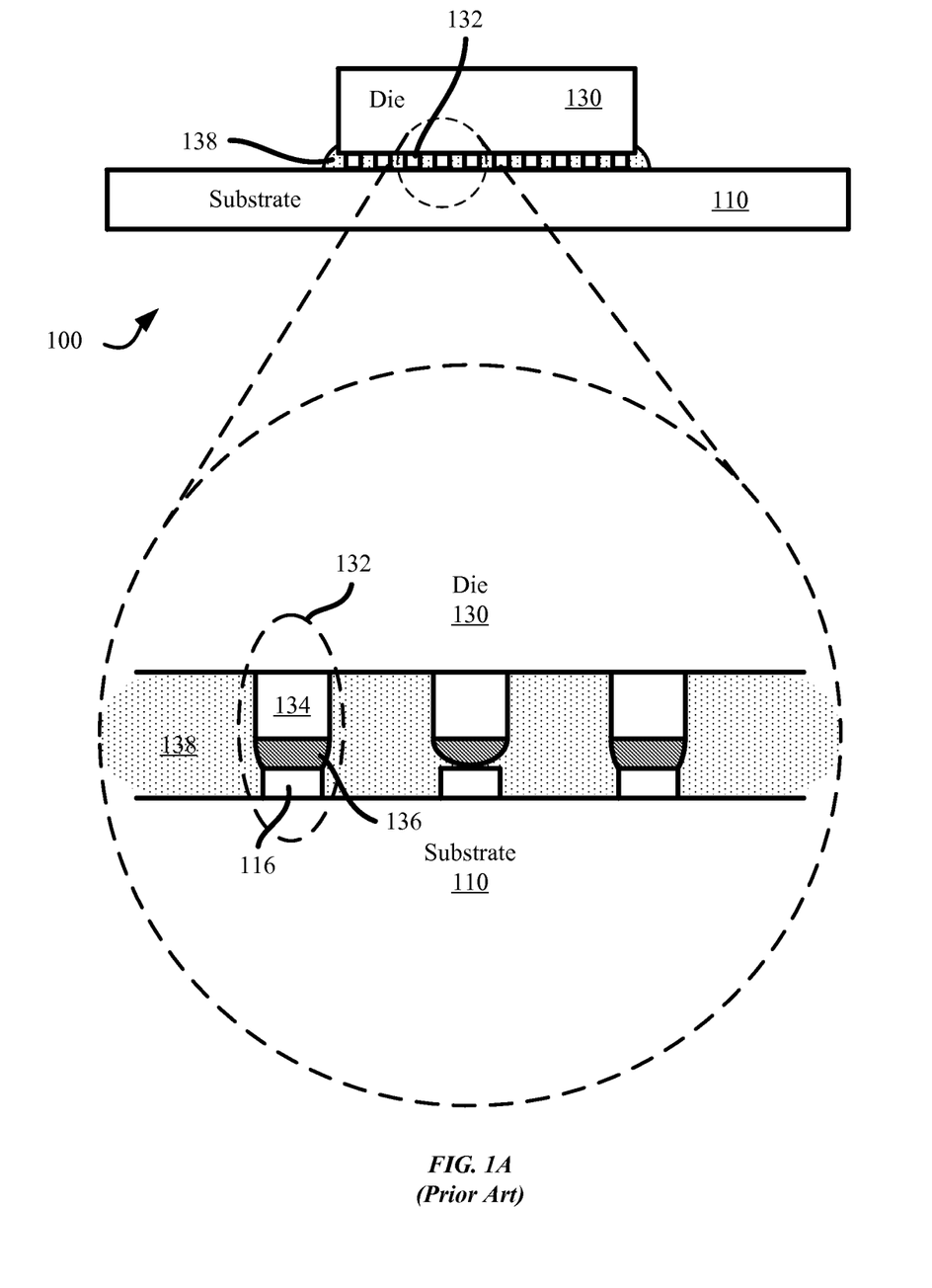
FIG. 1A illustrates a thermal compression flip chip coupled to a packaging substrate.

A thermal compression bonding process is a process used to assemble/package a flip chip, die or semiconductor device to a packaging substrate. Such a flip chip is often referred to as a thermal compression flip chip (TCFC). FIG. 1A illustrates an example of a package that includes a chip/die coupled to the semiconductor substrate 110 using a thermal compression bonding process. As shown in FIG. 1A, a package 100 includes a die/chip 130 that is coupled to a semiconductor substrate 110. There are several electrical connections 132 and a non-conducting paste (NCP) 138 between the die/chip 130 and the semiconductor substrate 110. The electrical connections may be defined by conductive structures (e.g., under bump metallization (UBM) structures (e.g., conductive interconnect 134)), solder (e.g., solder 136), bond pads, and traces (e.g., bond pads/traces 116). The NCP 138 provides a protective layer that covers the electrical connections between the die/chip 130 and the semiconductor substrate 110.

Flip chip technology is an alternative to conventional wire bonding technology, which uses face up chips and individual wires for connecting to each electrical pad on a chip. Typical flip chip technology involves a "Solder on Pad" (SOP) process for providing a good wetting surface to join with the die bump joints. The solder material is confined by an individual solder resist opening (SRO) over each pad. The use of individual SROs with typical flip chip technology consumes design real estate, and generally limits the minimum pitch to approximately one-hundred forty micrometers (140 μm). Fine pitch flip chip technology enables further pitch reduction by eliminating individual SROs in favor of a large SRO with many exposed leads/pads. This approach, however, creates a challenge for solder confinement. That is, unconfined solder may spread and cause shorts between the conductive interconnects, leading to reliability issues during operation of a completed package. A stencil printing process is one technique for supporting a solder on pad process, for example, as shown in FIG. 1B.

Figure 1B:
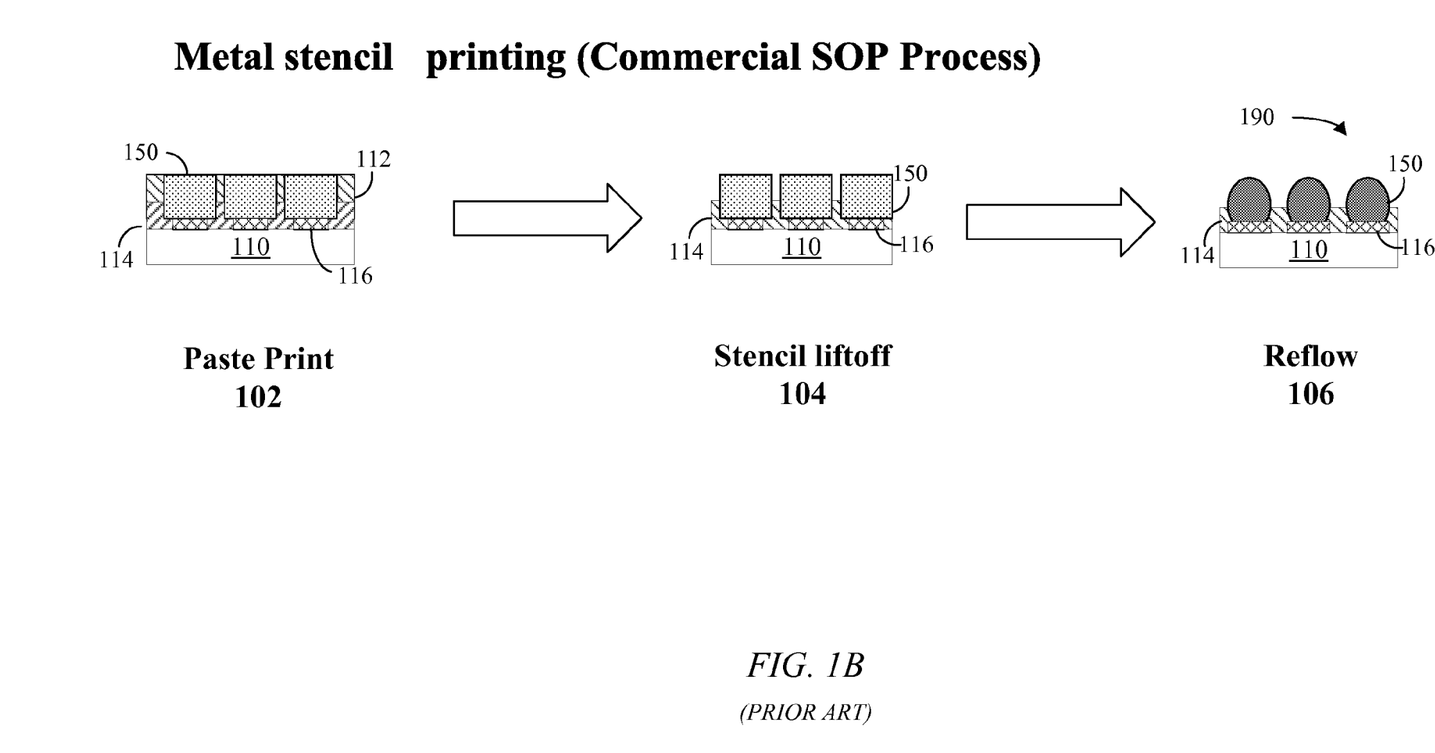
FIG. 1B is a block diagram illustrating a conventional conductive stencil printing process for a commercial solder on pad (SOP) process.

FIG. 1B is a block diagram illustrating a conventional conductive stencil printing process for a commercial solder on pad (SOP) process. At step 102, a semiconductor substrate 110 is provided. Bond pads/traces 116 are provided on the semiconductor substrate 110. Solder resist 114 is provided over the semiconductor substrate 110 and over the bond pads/traces 116. Openings are then formed in the solder resist 114 over the bond pad area to enable connections to the bond pads/traces 116. The removable stencil 112 is placed on the solder resist 114 and surrounds the bond pads/traces 116. Solder paste 150 is printed on the removable stencil 112. At step 104, the removable stencil 112 is removed (e.g., lifted off). At step 106, the solder paste 120 is reflowed to form an SOP device 190. The SOP process shown in FIG. 1B, however, is insufficient for achieving fine pitch, volume control and tolerance because the removable stencil cannot be patterned to achieve fine pitch, volume control and tolerance.

Various aspects of the disclosure provide techniques to improve solder on trace/bond pad technology for a fine pitch flip chip. As described herein, the terms "trace" and "bond pad" are used interchangeably. The improved solder on trace enables a fine pitch flip design. The fine pitch flip chip design may be applicable for thermal compression flip chips (TCFC), solder on pad technology, or other like interconnect technologies (e.g., through substrate via (TSV) micro bump connection). Aspects of the present disclosure may enable a trace pitch in the range of twenty to one hundred twenty microns.

In one configuration, the solder on trace technique enables activation of a bond area on the trace/pad to receive and to join with a conductive interconnect (e.g., a solder ball or copper (Cu) pillar) when a corresponding flip chip is attached to a semiconductor substrate including the trace/pad bond areas. That is, one aspect of the disclosure provides a selective pre-soldering of a predetermined trace/pad bonding area to form a wetting surface for joining with a corresponding solder ball, pillar, die bump joint, or other like conductive interconnect. As described herein, the term "semiconductor substrate" may refer to a substrate of a diced panel/wafer or may refer to the substrate of a wafer that is not diced (i.e., a wafer itself).

Figure 2:
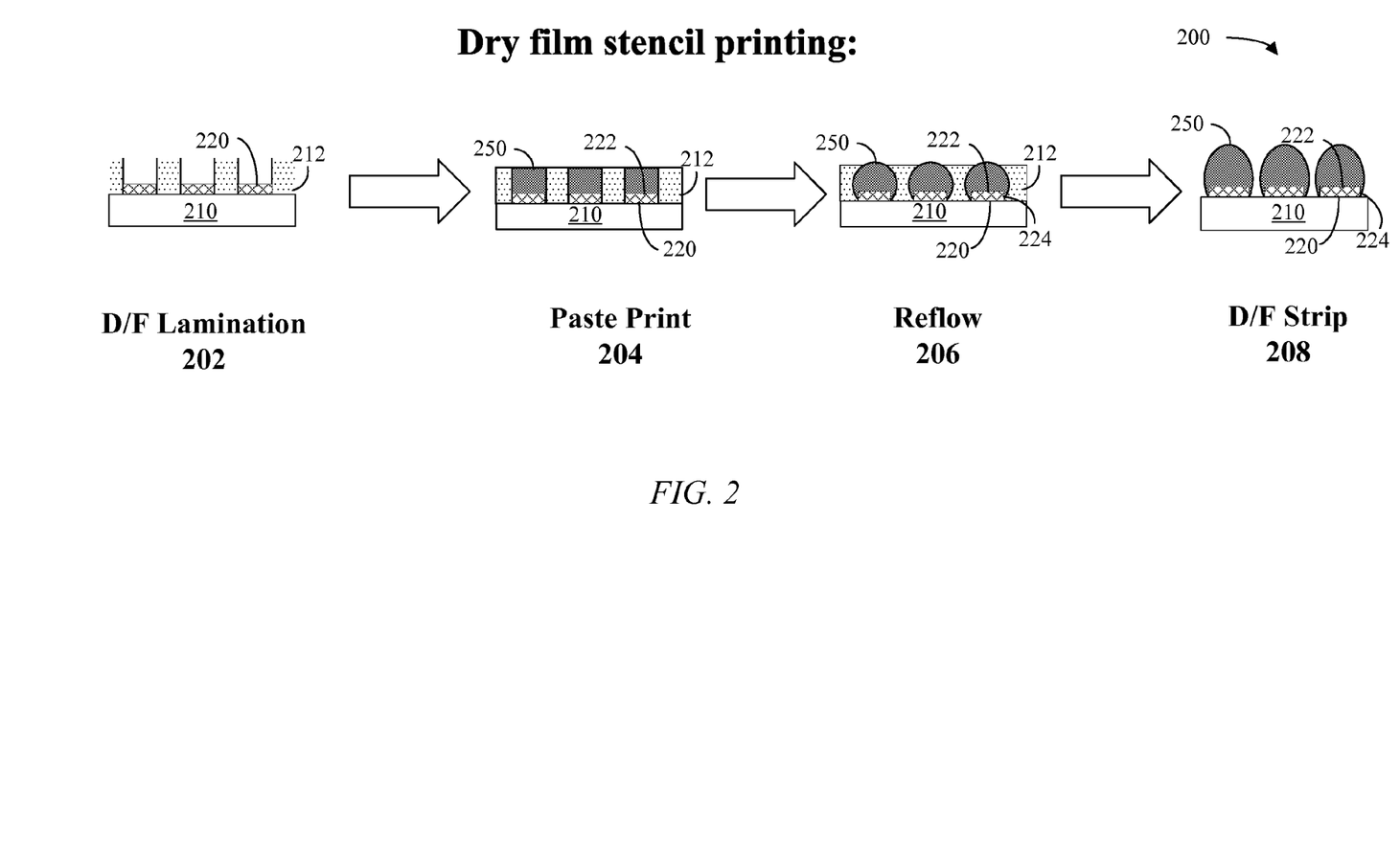
FIG. 2 is a block diagram illustrating a cross sectional view of a dry film stencil printing process for a solder on trace flip chip device according to one aspect of the disclosure.

FIG. 2 is a block diagram illustrating a cross sectional view of a dry film stencil printing process for a solder on trace flip chip device 200 according to one aspect of the disclosure. At step 202, a semiconductor substrate 210 is provided. Conductive traces 220 are provided on the semiconductor substrate 210. A dry film resist 212 is patterned over the semiconductor substrate 210 and over the conductive traces 220 to form a dry film stencil. Patterning of the dry film resist 212 enables the formation of dry film stencil with a fine pitch, volume control and tolerance that is unavailable from the metal stencil print process described in FIG. 1A.

In the configuration shown in FIG. 2, a film lamination process is performed to form the dry film resist 212, having traces (or bond pads) 220 in between and each disposed on a semiconductor substrate 210. It should be recognized that although a dry film resist 212 is shown in FIG. 2, the present disclosure is not limited to a dry film resist. Other resists are possible including liquid photoresists, dry photoresists, or other laser ablatable resist materials.

At step 204, a pre-solder material 250 is applied (e.g., printed) on a portion of the conductive traces 220, between the stencils formed by the dry film resist 212, which may be referred to herein as a bonding surface 222 of the conductive traces. The pre-solder material 250 may include but is not limited to a conductive paste, molten solder, a conductive liquid (e.g., Indium, Tin, SAC305), or other like pre-solder materials.

At step 206, the pre-solder material 250 is reflowed. In this configuration, reflowing of the pre-solder material 250 causes the formation of the pre-solder material 250 on the bonding surface 222 and the sidewalls 224 of the conductive trace 220.

At time 208, the dry film resist 212 is stripped, resulting in a solder on trace flip chip device 200. In this configuration, the pre-solder material 250 provides a wetting surface that joins with, for example, a corresponding solder ball of a flip-chip device.

FIGS. 3A-3E are block diagrams illustrating top down views of a solder on trace device 300 according to one aspect of the disclosure. FIG. 6 is a block diagram illustrating a method 600 for fabricating a solder on trace flip chip device, according to one aspect of the disclosure. The completed solder on trace device 300 is further described in FIGS. 4A-4D. A completed solder on trace flip chip device package is further described in FIG. 5.

Figure 3A:
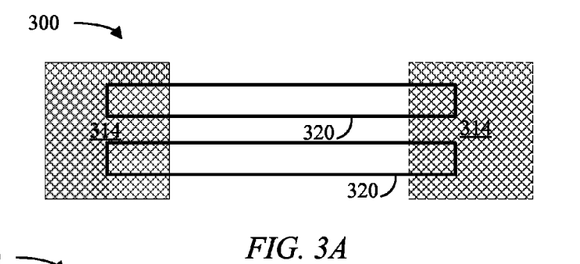
FIGS. 3A-3E are block diagrams illustrating top down views of a solder on trace flip chip device according to one aspect of the disclosure.

As shown in FIG. 3A, a semiconductor substrate (not shown) includes conductive traces 320 having a passivation layer 314 (e.g., solder resist) on opposing ends of the conductive traces 320. Although shown to include the passivation layer 314 on the opposing ends of the conductive traces 320, the passivation layer 314 may be placed on one end of the conductive traces 320, with the passivation layer 314 on the other end of the conductive traces 320 being optional. Furthermore, although shown as including conductive traces 320, the present disclosure is not so limited. The present disclosure may be applied to bond pads, traces, or other like conductive interconnects for joining a flip chip to the semiconductor substrate or on other like conductive interconnection.

Figure 3B:
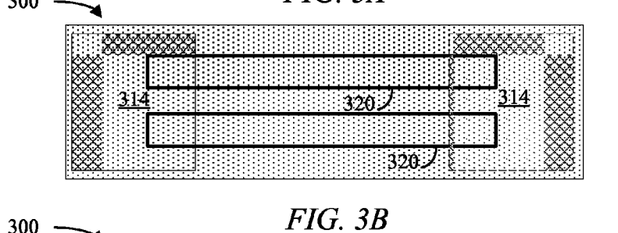

As shown in FIG. 3B, a film resist 312 is deposited on the conductive interconnects supported by a surface of a semiconductor substrate (not shown). In one configuration, the film resist 312 covers the passivation layer 314 and the conductive traces 320. In this configuration, a dry film resist is applied over the entire surface of the semiconductor substrate. It should be recognized that although the film resist 312 in FIG. 3 is a dry film resist, the present disclosure is not limited to dry film photoresists. Other resists are possible including liquid photoresists, dry photoresists, or other laser ablatable resist materials. In another configuration, the film resist 312 is applied to areas that are outside an active bonding area 330 of the conductive traces 320, for example, as shown in FIG. 3C.

Figure 3C:
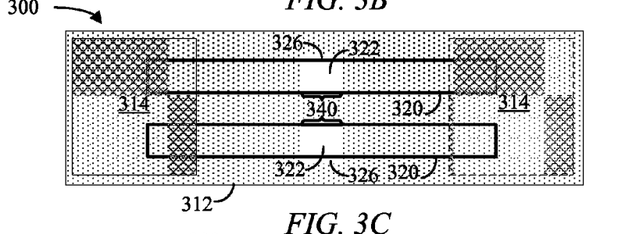

As shown in FIG. 3C, an active bonding area 340 of the conductive traces 320 is exposed. In this configuration, the bonding surfaces 322 of the conductive traces 320 and a peripheral trace area 326 are exposed to create the active bonding area 330. That is, the bonding surfaces 322 are the exposed portions of the conductive traces 320 and the peripheral trace area 326 is the area around the exposed portions of the conductive traces 320. The active bonding area 330 may be exposed using laser ablation or other like technique for etching the film resist 312 to expose the bonding surfaces 322 of the conductive traces 320 and the peripheral trace area 326, which may be referred to herein as "opening" of the active bonding area 340. As further described herein, "exposing" the active bonding area 340 refers to removal of the film resist 312 from a portion of the conductive traces 320 and the peripheral trace area 326 within the active bonding area 340.

As shown in FIG. 3C, the film resist 312 that remains on the surface of the semiconductor substrate is disposed on areas outside the active bonding area 330 of the conductive traces 320. In another configuration, a layer on a surface of the semiconductor substrate is opened to expose the active bonding area 340 (e.g., the bonding surfaces 322 and the peripheral trace area 326) of the conductive traces 320. In this configuration, the film resist 312 is applied to areas of the surfaces of the semiconductor substrate that are outside the active bonding area 340 of the conductive traces 320.

Figure 3D:
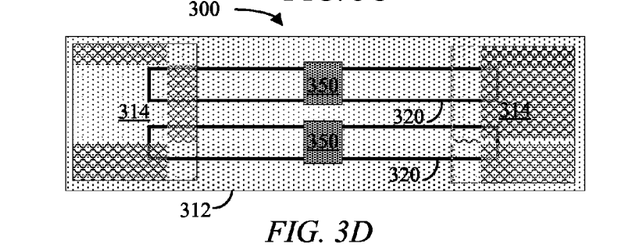

In FIG. 3D, a pre-solder material 350 is printed on the active bonding area 330 of the conductive traces 320. In this configuration, the active bonding area 330 includes exposed portions of the conductive traces 320 (e.g., the bonding surfaces 322 and the peripheral trace area 326). The pre-solder material 350 may include but is not limited to a solder paste, molten solder, conductive liquid (e.g., Indium, Tin, SAC305), or other like pre-solder material. Once the pre-solder material 350 is applied to the bonding surface 322 of the conductive traces 320, a reflow process may be performed to ball-up the pre-solder material 350 into ball shapes or any other shape that forms a wetting surface for joining with a flip chip interconnect (e.g., a solder ball, a pillar, a die bump joint, etc.)

Figure 3E:
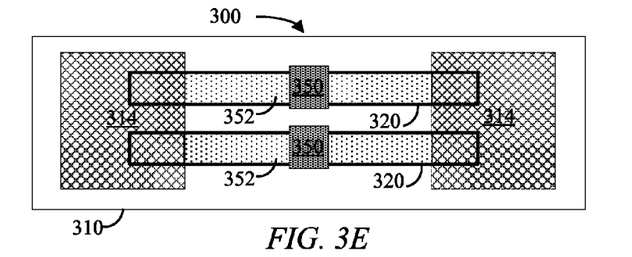

FIG. 3E illustrates the completed solder on trace device 300, including a pre-solder material 350 on the conductive traces 320 according to one aspect of the disclosure. Representatively, the film resist 312 is removed from the surface of the semiconductor substrate 310. A dry film residue 342 may remain on the exposed portions of the conductive traces 320, the surface of the semiconductor substrate 310 and/or the passivation layer 314. Alternatively, an oxidized layer may remain on exposed portions of the conductive traces 320 outside the active bonding area 330. As seen in FIGS. 3D and 3E, the pre-solder material 350 can also be disposed on portions of the semiconductor substrate surface (e.g., the peripheral trace area 326) adjacent to the bonding surfaces 322 of the conductive traces 320.

Figure 4A:
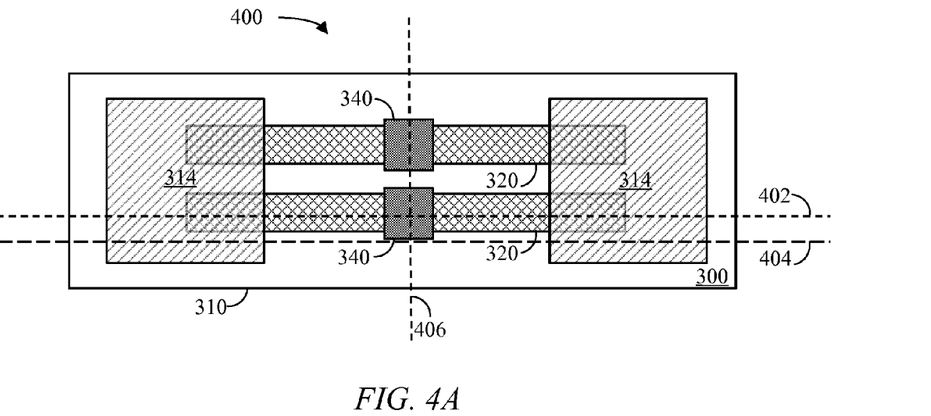
FIGS. 4A-4D are block diagrams illustrating a top down view (4A) and cross sectional views (4B-4D) of the solder on trace flip chip device of FIG. 3E, according to one aspect of the disclosure.
Figure 4B:
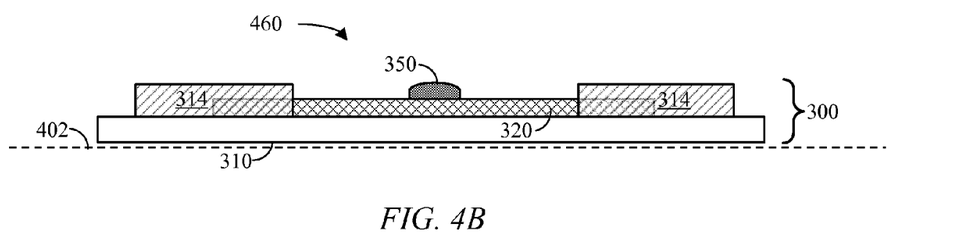
Figure 4C:
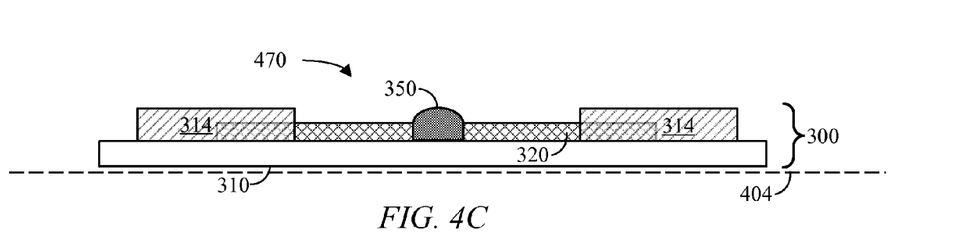

FIGS. 4A-4D are block diagrams illustrating a top down view and cross sectional views of the solder on trace device 300 of FIG. 3E, according to one aspect of the disclosure. FIG. 4A shows a top down view 400 of the solder on trace device 300 of FIG. 3E. Also shown are a first x-axis 402, a second x-axis 404, and a y-axis 406. FIG. 4B shows a cross sectional view 460 along the first x-axis 402 of FIG. 4A. FIG. 4C shows a cross sectional view 470 along the second x-axis 404 of FIG. 4A. In this configuration, the pre-solder material 350 is on the sidewalls of the conductive trace, as further illustrated in FIG. 4D.

Figure 4D:
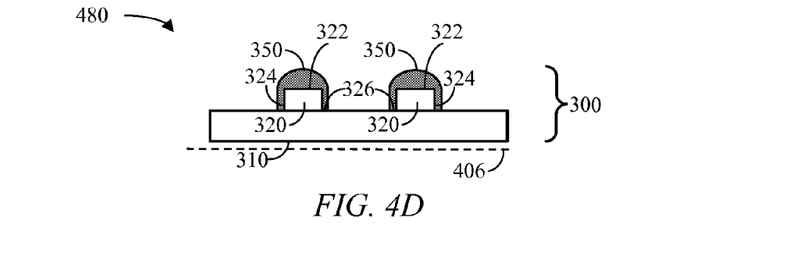

FIG. 4D shows a cross sectional view 480 along the y-axis 406 of FIG. 4A. In this configuration, the pre-solder material 350 is on the bonding surface 322, the sidewalls 324, and the peripheral trace area 326 of the conductive traces 320. The pre-solder material 350 may be printed on the bonding surface 322 of the conductive traces 320. In this configuration, reflow of the pre-solder material 350 causes the formation of the pre-solder material 350 on the bonding surface 322, the sidewalls 324, and the peripheral trace area 326 of the conductive traces 320.

Figure 5:
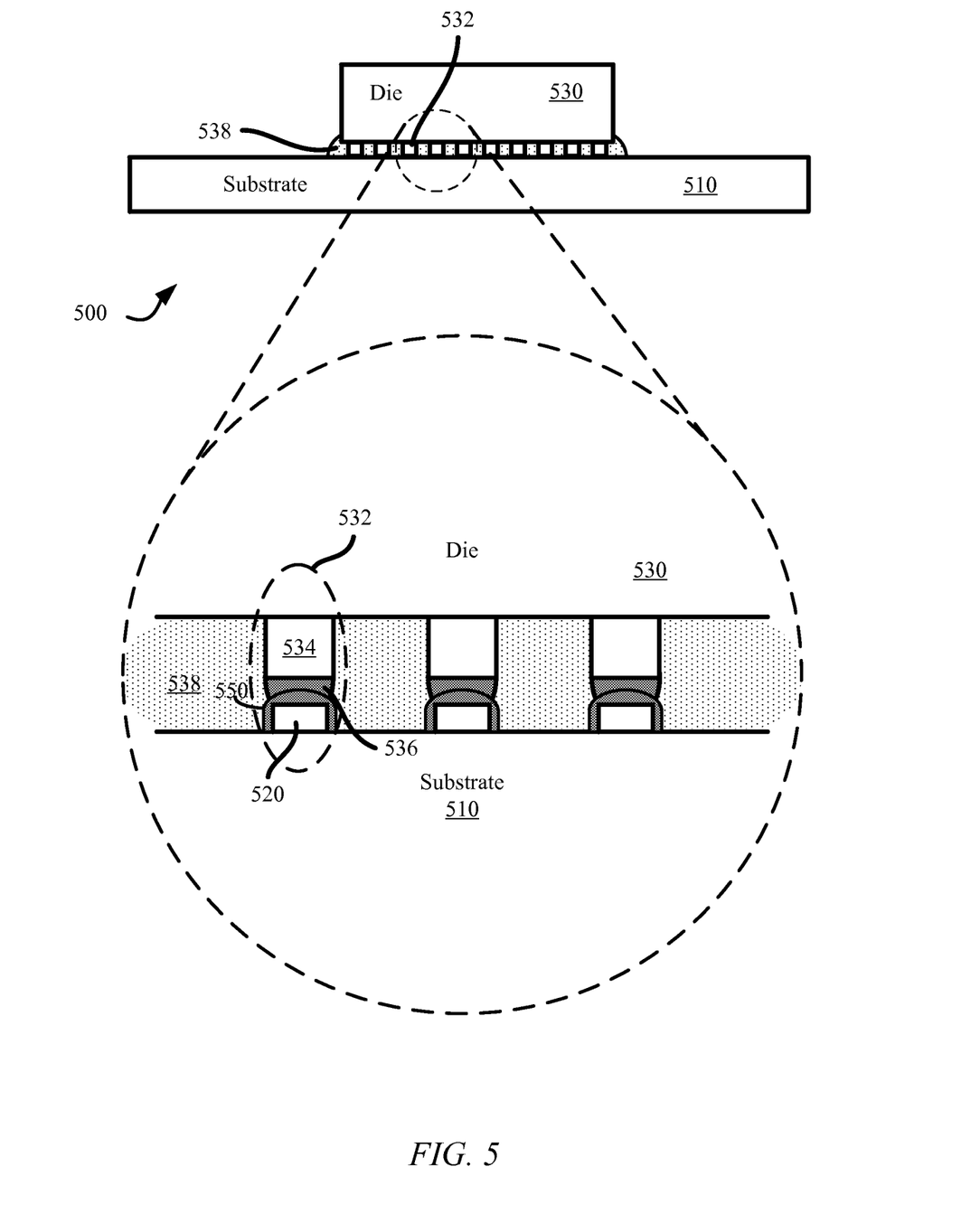
FIG. 5 illustrates a thermal compression solder on trace flip chip coupled to a packaging substrate, according to one aspect of the disclosure.
Figure 6:
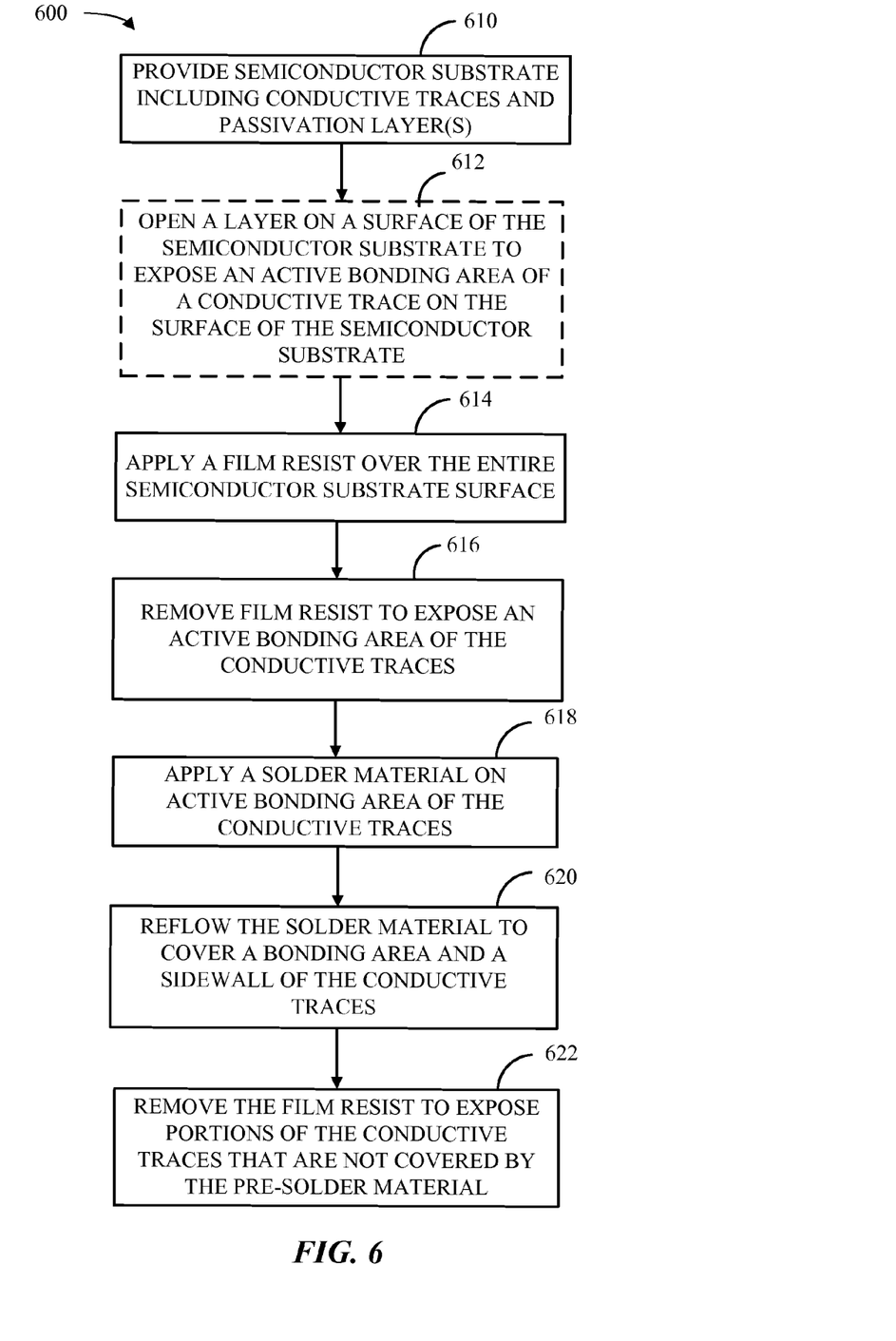
FIG. 6 is a block diagram illustrating a method for fabricating a solder on trace flip chip device, according to one aspect of the disclosure.

FIG. 5 illustrates a solder on trace flip chip package 500, according to one aspect of the disclosure. FIG. 5 illustrates an example of a package that includes a chip/die 530 coupled to a semiconductor substrate 510 using a thermal compression bonding process. As shown in FIG. 5, the solder on trace flip chip package 500 includes the die/chip 530 that is coupled to a semiconductor substrate 510. There are several electrical connections 532 and a non-conducting paste (NCP) 538 between the die/chip 530 and the semiconductor substrate 510. The electrical connections may be defined by conductive structures (e.g., the conductive interconnect 534), solder (e.g., solder 536), bond pads, and traces (e.g., pre-solder material 550 on bonding surfaces of the conductive traces 520).

FIG. 6 is a block diagram illustrating a method 600 for fabricating a solder on trace flip chip device, according to one aspect of the disclosure. The formation of the solder on trace device 300 is described with reference to FIGS. 3A-3E, 4A-4D and 5. As shown in FIG. 6, a semiconductor substrate 310 is initially provided that includes conductive traces 320 having a passivation layer 314 on at least one of the opposing ends of the conductive traces 320, as referred to in block 610. At block 612, a layer on the surface of the semiconductor substrate 310 is opened to expose an active bonding area 330 on the conductive traces 320 of the semiconductor substrate 310. The layer on the surface of the semiconductor substrate 310 may be opened by an exposure and development process. At block 614, a film resist 312 is applied over an entire surface of the semiconductor substrate 310. Alternatively, the film resist 312 is applied to areas of the surface of the semiconductor substrate 310 outside the active bonding area 330.

As further shown in FIG. 6 at block 616, the film resist 312 is removed to expose the active bonding area 330 on the conductive traces 320. In this configuration, the pre-solder material 350 is exposed through openings in the film resist 312 created during block 616. At block 618, a solder material is applied (e.g., printed) on the active bonding area 330 on the conductive traces 320. At block 620, the pre-solder material 350 is reflowed to cover the bonding surfaces 322 and the sidewalls 324 of the conductive traces 320, for example, as shown in FIG. 4D. The pre-solder material 350 may also be disposed on the peripheral trace area 326. At block 622, the film resist 312 is removed to expose portions of the conductive traces 320 that are not covered by the pre-solder material 350. The removal of the film resist 312 reopens, for example, a solder resist trench that may contain underfill material during assembly.

In one configuration, the solder on trace device 300 includes a means for passivating on at least one end of an interconnecting means on a surface of a semiconductor substrate. The solder on trace device 300 also includes a means for conducting on a sidewall and a bonding surface of the interconnecting means. The conducting means has a conductive material. In one aspect of the disclosure, the conducting means is the pre-solder material 350/550 of FIGS. 3A-3E, 4A-4D and 5, configured to perform the functions recited by the conducting means. The interconnecting means may be the conductive trace 320, a contact, or a bond pad. The passivation means may be the passivation layer 314. In another aspect, the aforementioned means may be any device or any layer configured to perform the functions recited by the aforementioned means.

Figure 7:
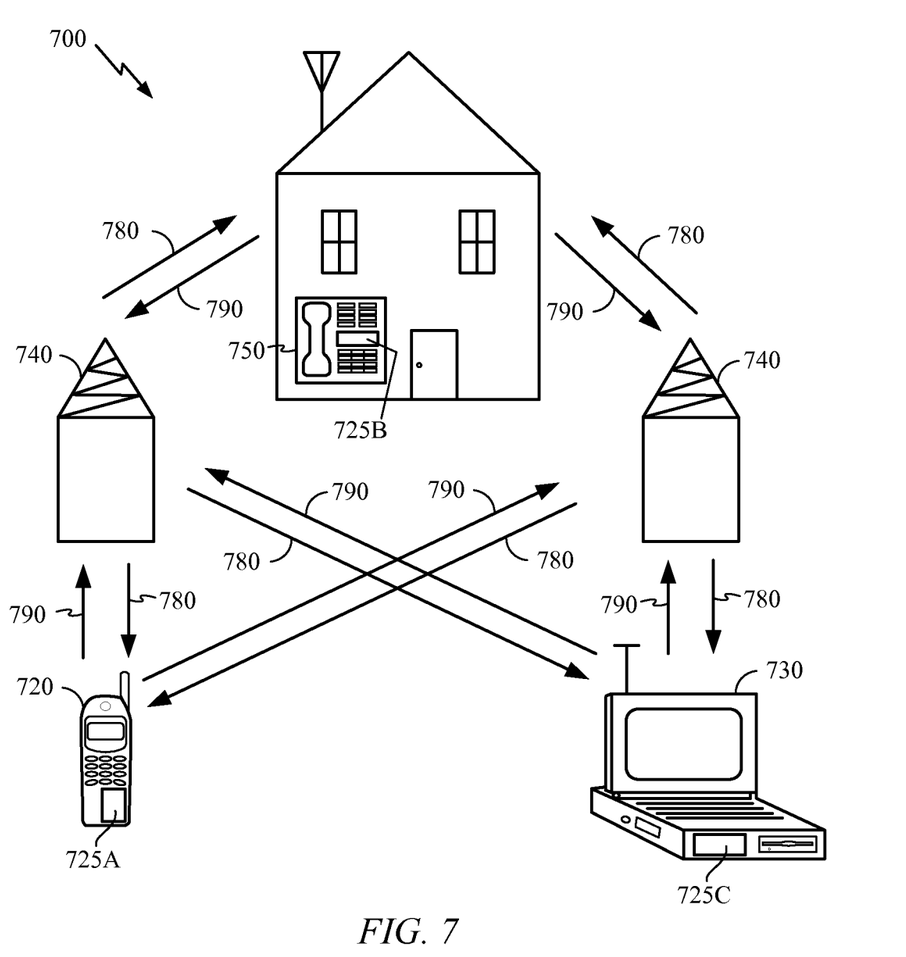
FIG. 7 is a block diagram showing a wireless communication system in which a configuration of the disclosure may be advantageously employed.

FIG. 7 is a block diagram showing an exemplary wireless communication system 700 in which a configuration of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725B, and 725C, which include the disclosed solder on trace device. It will be recognized that any device containing an IC may also include a solder on trace device, as disclosed herein, including the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 7 illustrates IC devices 725A, 725B, and 725C, which include the disclosed solder on trace device, the disclosure is not limited to these exemplary illustrated units. Aspects of the present disclosure may be suitably employed in any device, which includes a solder on trace device.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
    a conductive trace on a package substrate surface, the conductive trace comprising a bonding surface and a sidewall;
    a passivation layer on at least one end of the conductive trace;
    a pre-solder material for forming a wetting surface on the sidewall and the bonding surface of the conductive trace; and
    a solder material coupled to the pre-solder material, wherein the solder material is distinct from the pre-solder material, and wherein a combination of the pre-solder material and the solder material forms a non-uniform solder material.

2. The device of claim 1, in which the pre-solder material is on a portion of the package substrate surface.

3. The device of claim 1, further comprising an oxidation layer on exposed portions of the conductive trace outside the bonding surface.

4. The device of claim 1, further comprising a dry film residue on portions of the conductive trace, the package substrate surface and the passivation layer.

5. The device of claim 1, in which a pitch of the conductive trace and another conductive trace is less than one hundred fifty microns.

6. The device of claim 1, in which the pre-solder material comprises a conductive paste, a molten solder, or a conductive liquid.

7. The device of claim 1, incorporated into at least one of a music player, a video player, an entertainment unit, a navigation device, a communications device, a personal digital assistant (PDA), a fixed location data unit, and a computer.

8. The device of claim 1, wherein a portion of the pre-solder material is disposed on a peripheral trace area of the conductive trace.

9. The device of claim 1, wherein the solder material is electrically coupled to a die.

10. The device of claim 1, wherein a portion of the solder material is coupled to the bonding surface of the conductive trace.

11. The device of claim 1, wherein the pre-solder material comprises a first material, and the solder material comprises a second material that is different than the first material.

12. A device, comprising:
    a means for interconnecting, wherein the means for interconnecting is on a package substrate surface, and wherein the means for interconnecting comprises a bonding surface and a sidewall;
    a means for passivating, on at least one end of the means for interconnecting;
    a means for conducting applied on the sidewall and the bonding surface to form at least one wetting surface; and
    a solder material coupled to the means for conducting, wherein the solder material is distinct from the means for conducting, and wherein a combination of the means for conducting and the solder material forms a non-uniform solder material.

13. The device of claim 12, in which the means for conducting comprises a pre-solder material.

14. The device of claim 12, in which the means for conducting is on a portion of the package substrate surface.

15. The device of claim 12, further comprising an oxidation layer on exposed portions of the means for interconnecting that are outside the bonding surface.

16. The device of claim 12, further comprising a dry film residue on portions of the means for interconnecting.

17. The device of claim 12, in which a pitch of the means for interconnecting and another means for interconnecting is less than one hundred fifty microns.

18. The device of claim 12, in which a film resist covers at least a portion of the means for conducting, and wherein the film resist comprises a dry film photoresist or a liquid photoresist.

19. The device of claim 12, incorporated into at least one of a music player, a video player, an entertainment unit, a navigation device, a communications device, a personal digital assistant (PDA), a fixed location data unit, and a computer.

20. The device of claim 12, wherein a portion of the solder material is coupled to the bonding surface of the means for interconnecting.

21. The device of claim 12, wherein the means for conducting comprises a first material, and the solder material comprises a second material that is different than the first material.

22. A device, comprising:
    a conductive trace on a package substrate surface, the conductive trace comprising a bonding surface and a sidewall;
    a passivation layer on at least one end of the conductive trace;
    a pre-solder material for forming a wetting surface on the sidewall and the bonding surface of the conductive trace;
    a non-conductive paste (NCP) surrounding at least a portion of the pre-solder material; and
    a die in contact with the non-conductive paste (NCP), the die comprising a conductive interconnect and a solder material coupled to the conductive interconnect, wherein the solder material is coupled to the pre-solder material, and wherein a combination of the pre-solder material and the solder material forms a non-uniform solder material.

23. The device of claim 22, wherein the non-conductive paste (NCP) is between the die and the package substrate surface.

* * * * *